(12) United States Patent
Dave et al.

(10) Patent No.: US 9,069,687 B2
(45) Date of Patent: Jun. 30, 2015

(54) MEMORY READ-CHANNEL WITH SELECTIVE TRANSMISSION OF ERROR CORRECTION DATA

(75) Inventors: Nirav P. Dave, Sunnyvale, CA (US); Nils Graef, Sunnyvale, CA (US); Johnson Yen, Fremont, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 840 days.

(21) Appl. No.: 12/696,572

(22) Filed: Jan. 29, 2010

(65) Prior Publication Data

US 2011/0191652 A1 Aug. 4, 2011

(51) Int. Cl.
*H03M 13/00* (2006.01)
*G11C 29/00* (2006.01)
*G06F 11/10* (2006.01)
*H03M 13/09* (2006.01)
*H03M 13/29* (2006.01)
*H03M 13/07* (2006.01)
*H03M 13/15* (2006.01)

(52) U.S. Cl.
CPC ............... *G06F 11/10* (2013.01); *H03M 13/07* (2013.01); *H03M 13/09* (2013.01); *H03M 13/15* (2013.01); *H03M 13/29* (2013.01)

(58) Field of Classification Search
CPC ........ H03M 13/03; G11C 29/42; G01R 31/28
USPC ........................................................ 714/758
See application file for complete search history.

(56) References Cited

U.S. PATENT DOCUMENTS

| 5,459,742 | A | * | 10/1995 | Cassidy et al. | 714/769 |
| 5,737,344 | A | * | 4/1998 | Belser et al. | 714/766 |
| 6,145,069 | A | * | 11/2000 | Dye | 711/170 |
| 6,175,783 | B1 | * | 1/2001 | Strength et al. | 701/13 |
| 6,823,425 | B2 | * | 11/2004 | Ghosh et al. | 711/114 |
| 7,203,886 | B2 | * | 4/2007 | Brown et al. | 714/758 |
| 7,430,705 | B2 | * | 9/2008 | Uchida | 714/794 |
| 7,434,136 | B2 | * | 10/2008 | Ichihara et al. | 714/755 |
| 7,979,633 | B2 | * | 7/2011 | Kleiman et al. | 711/114 |
| 8,159,889 | B2 | * | 4/2012 | Ryu | 365/198 |
| 8,181,089 | B1 | * | 5/2012 | Fernandes et al. | 714/770 |
| 2006/0218343 | A1 | * | 9/2006 | Higashijima et al. | 711/114 |
| 2010/0023841 | A1 | * | 1/2010 | Scharfe et al. | 714/763 |
| 2010/0169743 | A1 | * | 7/2010 | Vogan et al. | 714/773 |

* cited by examiner

*Primary Examiner* — M. Mujtaba K Chaudry
(74) *Attorney, Agent, or Firm* — Sheridan Ross P.C.

(57) ABSTRACT

A memory read-channel is provided with selective transmission of error correction data. The disclosed read-channel improves throughput and reduces power consumption when error correction codes are unnecessary. The data read from a memory device comprises user data, error detection data and error correction data. In one embodiment, the error detection data is evaluated to determine if there is a data error; and the error correction data is transmitted only if a data error is detected. In another variation, the error detection data is evaluated during data transmission to determine if there is a data error and the transmission is suspended if a data error is detected. Typically, the error detection data comprises a cyclic redundancy check and the error correction data comprises parity check data.

25 Claims, 3 Drawing Sheets

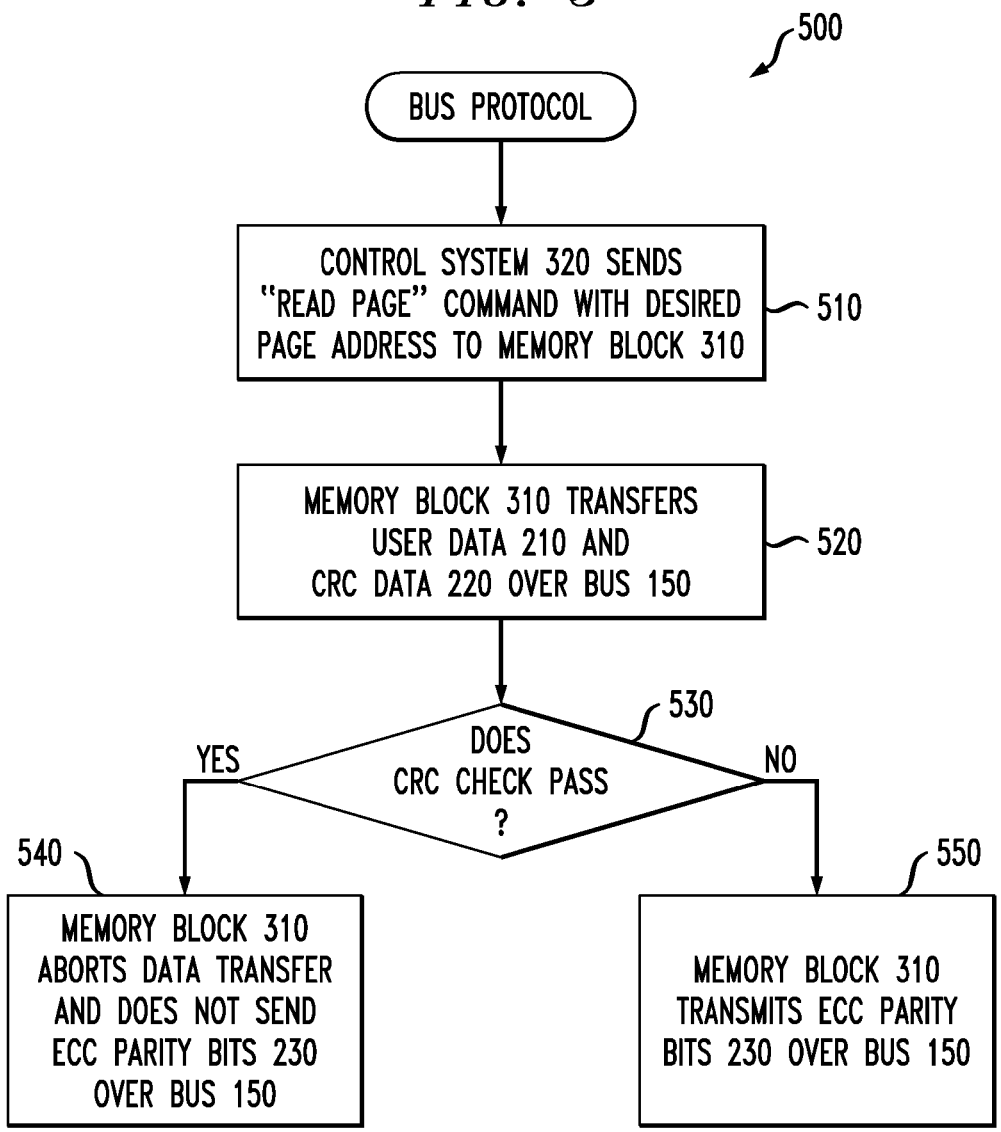

MEMORY READ-CHANNEL WITH SELECTIVE TRANSMISSION OF ERROR CORRECTION DATA

FIELD OF THE INVENTION

The present invention relates generally to data storage systems, and more particularly, to methods and apparatus for improving the data throughput of such data storage systems.

BACKGROUND OF THE INVENTION

Data storage devices record data on a recordable medium using some form of energy. Hard Disk Drives (HDDs), for example, store data on rotating platters having magnetic surfaces. Solid State Drives (SSDs) employ solid-state memories, such as flash memory devices, to persistently store data. HDDs and SSDs are both non-volatile storage devices that do not require power to maintain the stored information. In addition, HDD and SSD storage devices typically offer relatively fast read access times.

Nonetheless, reduced power consumption and improved data throughput remain important design goals for any storage system. Data throughput is typically obtained by measuring the time required to store, retrieve or otherwise transfer data. Data throughput is typically expressed, for example, as the number of bits transferred per time interval (such as bits-per-second). Power consumption is becoming increasingly important for storage applications, such as HDDs and SSDs. Power consumption issues require that storage devices have sufficient power to operate, and also have important environmental and electrical cost implications.

Throughput and power efficiency are impaired, for example, when bit errors occur. Bit errors occur during transmission or storage of data for a number of reasons, such as noise, interference, or defects on a storage medium. Error correcting decoders process the data and attempt to correct errors and recover the original data. While existing HDD and SSD storage devices have achieved significant improvements in satisfactory reliability and performance, they suffer from a number of limitations, which if overcome, could further improve the reliability and performance of such storage systems. For example, most HDD and SSD storage devices incur significant overhead by storing, transmitting and/or decoding data using error correction techniques. Nonetheless, such error correction codes may be unnecessary if the data is successfully decoded. A need therefore exists for improved techniques for data reliability and performance in storage devices. A further need exists for a memory read channel that improves throughput and reduces power consumption when error correction codes are unnecessary.

SUMMARY OF THE INVENTION

Generally, a memory read-channel is provided with selective transmission of error correction data. The disclosed read-channel improves throughput and reduces power consumption when error correction codes are unnecessary. According to one aspect of the invention, a method is provided for reading data from a memory device. The data comprises user data, error detection data and error correction data. The error detection data is evaluated to determine if there is a data error; and the error correction data is transmitted only if a data error is detected.

Typically, the error detection data comprises a cyclic redundancy check and the error correction data comprises parity check data. The data can be encoded, for example, using one or more of Reed Solomon codes, LDPC codes, turbo codes, convolutional codes, parity check codes, BCH codes and trellis codes. The memory device can be part of a Hard Disk Drive (HDD) storage system or a Solid State Drive (SSD) storage system.

According to another aspect of the invention, a method is provided for reading data from a memory device. The data comprises user data, error detection data and error correction data. The error detection data is evaluated during data transmission to determine if there is a data error. The transmission is suspended if a data error is detected.

A more complete understanding of the present invention, as well as further features and advantages of the present invention, will be obtained by reference to the following detailed description and drawings.

BRIEF DESCRIPTION OF THE DRAWINGS

FIG. 5 is a flow chart describing an exemplary implementation of a bus protocol for reading and transferring the data from the storage medium in accordance with the present invention.

DETAILED DESCRIPTION

As discussed hereinafter, the present invention provides a memory read channel with improved data throughput and reduced power consumption. According to one aspect of the invention, data throughput is improved and power consumption is reduced in a memory read-channel by terminating the transmission of error correction data, such as parity data, if an initial error check, such as a cyclic redundancy check, succeeds. The present invention applies to any non-volatile memory technology, including hard disk drives (HDDs), solid state disks (SSDs) and flash drives. The present invention can be employed with any storage mechanism for storing and transferring a value in a memory device, such as the use of voltages, currents or resistances to represent stored data, as would be apparent to a person of ordinary skill in the art.

Figure 1:
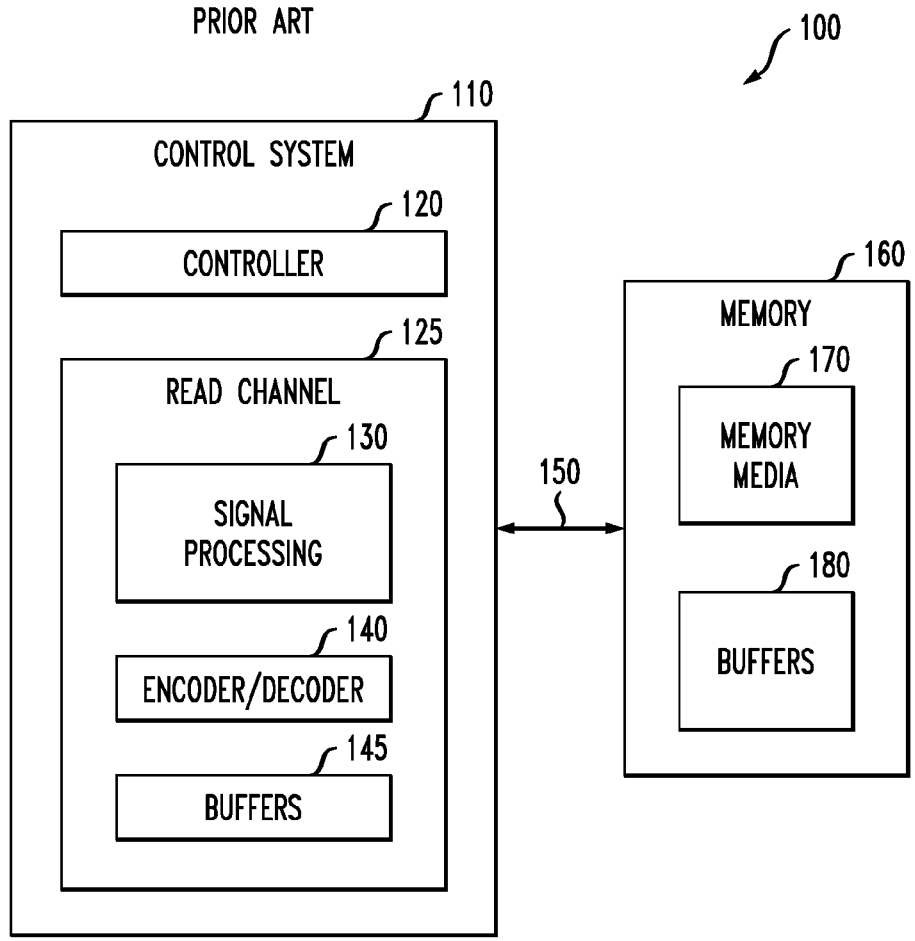
FIG. 1 is a schematic block diagram of a conventional memory system.

FIG. 1 is a schematic block diagram of a conventional memory system 100. As shown in FIG. 1, the exemplary memory system 100 comprises a control system 110 and a memory block 160, connected by an interface 150. The exemplary control system 110 comprises a controller 120 and a read channel 125, typically on one or more integrated circuits.

The exemplary read channel 125 comprises a signal processing unit 130, an encoder/decoder block 140 and one or more buffers 145. It is noted that the term "read channel" can encompass the write channel as well. In an alternative embodiment, the encoder/decoder block 140 and some buffers 145 may be implemented inside the controller 120. The encoder/decoder block 140 and buffers 145 may be implemented, for example, using well-known commercially available techniques and/or products. The exemplary signal processing unit 130 and encoder/decoder 140 typically implement a single algorithm with fixed precision. For a discussion of read channel and signal processing algorithms for hard disk drives, see for example, E. F. Haratsch and Z. A.

Keirn, "Digital Signal Processing in Read Channels," IEEE Custom Integrated Circuits Conference, 683-90 (September 2005), or A. Kavcic and A. Patapoutian "The Read Channel," Proc. of the IEEE, Vol. 96,Issue 11, 1761-74 (November 2008), each incorporated by reference herein.

For example, in an SSD or flash drive application, the signal processing unit 130 may comprise one or more processors that implement one or more soft demapping or soft data generation processes, or intercell interference cancellation processes. For a more detailed discussion of a suitable read channel 120, signal processing unit 130 and/or controller 120 in an SSD of flash drive application, see, for example, International Patent Application Serial No. PCT/US09/49326, filed Jun. 30, 2009,entitled "Methods and Apparatus for Read-Side Intercell Interference Mitigation in Flash Memories;" or International Patent Application Serial No. PCT/US09/59077,filed Sep. 30, 2009,entitled "Methods and Apparatus for Soft Data Generation for Memory Devices," each incorporated by reference herein.

The exemplary memory block 160 comprises a memory media 170 and one or more buffers 180 that may each be implemented using well-known commercially available techniques and/or products. The memory media 170 may be implemented, for example, as a hard disk drive (HDD), a solid state disk (SSD), a flash drive, or other non-volatile memory. In a solid state disk implementation, for example, the memory media 170 may be embodied, for example, as a single-level or multi-level cell flash memory, such as a NAND flash memory, a phase-change memory (PCM), an MRAM memory, a NOR flash memory or another non-volatile flash memory. During a read operation, the interface 150 transfers hard and/or soft read values that have been obtained from the memory media 170. The data format for the interface 150 is discussed further below in conjunction with FIGS. 2 and 3.

In an SSD or flash memory application, the memory media 170 may assign one or more bits to each memory cell, for example, based on a comparison of the measured voltages to the voltage level thresholds (likewise for memory implementations using currents or resistances), which are then transmitted as hard decisions to the read channel 125. In addition or alternatively, in an implementation using soft information, the memory media 110 may transmit the measured voltages or a quantized version of the measured voltages to the read channel 120 as soft information, where a larger number of bits are used to represent the measured voltage than the number of bits stored in the memory cell. The soft information may comprise, for example, probability or reliability information.

For a more detailed discussion of suitable conventional magnetic storage systems, see, for example, Z. A. Keirn et al., "Use of Redundant Bits for Magnetic Recording: Single-Parity Codes and Reed-Solomon Error-Correcting Code," IEEE Transactions on Magnetics, Vol. 40, 225-230 (January 2004).

Figure 2:
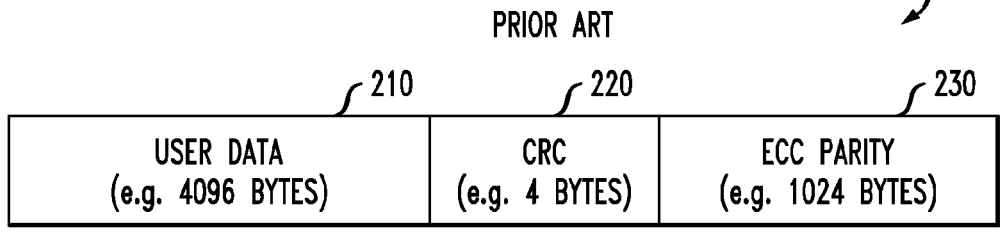
FIG. 2 illustrates an exemplary conventional data format for a typical flash memory page.

FIG. 2 illustrates an exemplary conventional data format 200 for a typical flash memory page. As shown in FIG. 2, the exemplary data format 200 comprises user data 210, followed by a cyclic redundancy check (CRC) 220 and error correction code (ECC) parity bits 230. In the exemplary embodiment shown in FIG. 2, the CRC 220 comprises 32 bits (4 bytes) and the ECC 230 comprises 1024 bytes of data. Likewise, the data sector format for a HDD (not shown) has ECC data and CRC data associated with the user data to provide improved resilience to errors.

As previously indicated, throughput is increased when data is read without bit errors. Error detection and correction techniques, such as cyclic redundancy checks and parity checks, typically ensure that data is transmitted with reduced errors. Generally, acyclic redundancy check is a hash function that produces a checksum for detecting errors, in a well-known manner. CRCs are typically calculated before a data transfer to compute the parity bits and after a data transfer to determine if there is an error, in a known manner. Typically, the results are compared to confirm that they are equal (indicating no error). Error correction codes add redundant data, or parity data, to the user data 210, such that the user data 210 can he recovered even when errors are introduced, in a well-known manner.

Error correcting codes, such as Reed-Solomon codes, Low Density Parity Check (LDPC) codes, turbo codes, convolutional codes, parity check codes, BCH codes and trellis codes, have a wide range of applications in digital communications and storage. Reed-Solomon codes, for example, add redundant bits to a digital stream prior to transmission or storage, so that a decoder can detect and possibly correct errors caused by noise or other interference. Generally, a Reed-Solomon encoder takes a block of digital data, comprising a sequence of digital information bits, and interprets the data as a sequence of information symbols. Each symbol comprises m bits of the digital information sequence. The block of input data comprises r such information symbols. The Reed-Solomon encoder produces p additional redundant symbols, which are concatenated with the r information symbols to form a codeword comprising n (equal to r plus p) symbols. For a more detailed discussion of conventional Reed-Solomon decoding, see, for example, L. Reggiani and G. Tartara. "On Reverse Concatenation and Soft Decoding Algorithms for PRML Magnetic Recording Channels," IEEE Journal on Selected Areas in Communications, vol. 19, 612-618 (April 2001), incorporated by reference herein.

For a discussion of suitable LDPC codes and LDPC decoding (such as Belief Propagation, Message Passing, Sum-Product or Min-Sum decoding), see, for example, A. J. Blanksby and C. J. Howland, "A 690-mW 1-Gb/s 1024-b, Rate-½ Low-Density Parity-Check Decoder," IEEE J. Solid-State Circuits, Vol. 37, 404-412 (March 2002); D. E. Hocevar, "LDPC Code Construction With Flexible Hardware Implementation," IEEE Intl Conf. on Comm. (ICC), Anchorage, Ak., 2708-2712 (May, 2003), or R. N. S. Ratnayake, E. F. Haratsch and Gu-Yeon Wei, "A Bit-Node Centric Architecture for Low-Density Parity Check Decoders," IEEE Global Telecommunications Conference (Globecom), Washington, D.C., 265-270 (November 2007), each incorporated by reference herein.

Figure 3:
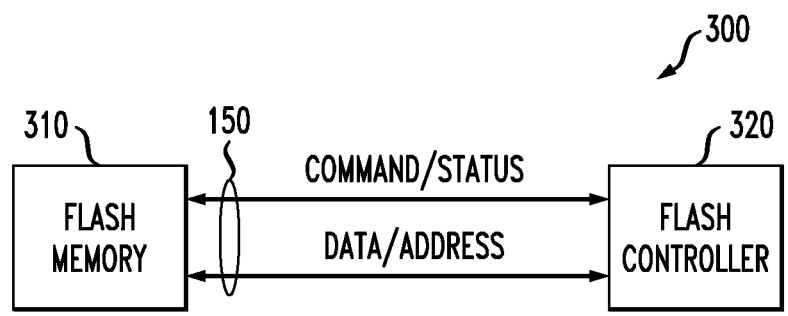
FIG. 3 illustrates the bidirectional bus of FIG. 1 in further detail, for an exemplary flash memory storage system.

FIG. 3 illustrates the bidirectional bus 150 of FIG. 1 in further detail, for an exemplary flash memory storage system 300. It is noted that the present invention is not limited to bidirectional buses 150 and can also be applied to a unidirectional bus, as would be apparent to a person of ordinary skill in the art. As shown in FIG. 3, the exemplary memory system 300 comprises a control system 320, such as a flash controller, and a memory block 310, such as a flash memory, connected by the bidirectional bus (interface) 150. For an exemplary flash memory system, the bidirectional bus 150 may be implemented, for example, in accordance with the Open NAND Flash Interface (ONFI) standard. As shown in FIG. 3, the control system 320 and a memory block 310 exchange commands and status information over the bus 150, as well as data and address information. Data is exchanged on the conventional bus 150 in accordance with a communication protocol discussed further below in conjunction with FIG. 4.

Figure 4:
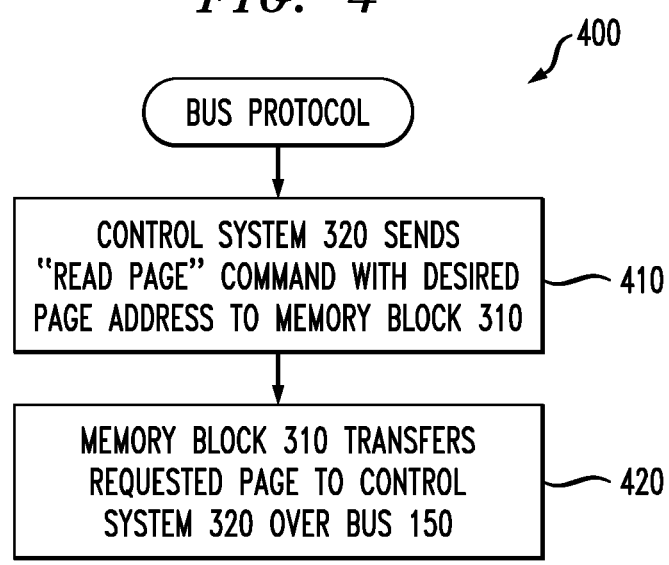
FIG. 4 is a flow chart describing an exemplary implementation of a conventional bus protocol for reading and transferring the data from the storage medium.

FIG. 4 is a flow chart describing an exemplary implementation of a conventional bus protocol 400 for reading and transferring the data from the storage medium. The conventional bus protocol 400 is typically implemented by the control system 320. As shown in FIG. 4, in accordance with the conventional bus protocol 400, the control system 320 initially sends a "READ PAGE" command along with a desired page address to the memory block 310 during step 410. Thereafter, the memory block 310 transfers the entire contents of the requested page to the control system 320 during step 420 over the bus 150, including the user-data 210, the CRC data 220, and the ECC parity bits 230.

The present invention recognizes that the ECC bits 230 are unnecessarily transferred over the bus 150 if the evaluation of the CRC 220 succeeds.

FIG. 5 is a flow chart describing an exemplary implementation of a bus protocol 500 for reading and transferring the data from the storage medium in accordance with the present invention. The bus protocol 500 is typically implemented by a modified control system 320. As shown in FIG. 5, the modified control system 320 initially sends a "READ PAGE" command along with a desired page address to the memory block 310 during step 510. Thereafter, the memory block 310 transfers the user data 210, followed by the CRC data 220 during step 520.

The control system 320 performs a test during step 530 to determine if the CRC check passes. If it is determined during step 530 that the CRC check passes, then program control proceeds to step 540 where the memory block 310 aborts the data transmission and does not send the ECC parity bits 230 over the bus 150. In this manner, bandwidth and controller processing resources are saved. If, however, it is determined during step 530 that the CRC check fails, then the memory block 310 transmits the ECC parity bits 230 during step 550.

It is noted that a handshaking protocol can be defined between the memory block 310 and the control system 320, as would be apparent to a person of ordinary skill in the art. For example, the memory block 310 may send the contents of the requested page to the control system 320, until the read request is aborted by the control system 320 (upon a successful CRC check), or the memory block 310 may only send the ECC data 230 if specifically requested by the control system 320 (e.g., upon a CRC failure).

In an exemplary implementation, the average throughput is increased by factor, f, equal to $(1-PER)*(1-R)$, where PER is the page error rate without ECC, and R is the code-rate of the ECC (i.e., R is the number of user bits plus CRC bits divided by the total number of bits including ECC parity).

Since the dynamic power consumption of the bus is proportional to the switching activity on the data bus, the average power consumption is reduced by approximately the same factor, f. In addition, the average read power of the memory block 310 is reduced by approximately the same factor, f. For example, if the PER is equal to $10^{-2}$, and R is equal to 0.8, then the throughput is increased by a factor, f, equal to 0.99*0.2 (19.8%). Likewise, the power consumption is reduced by approximately the same factor of 19.8%.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method performed by a control system for obtaining data from one of a flash memory device and a hard disk drive, wherein said data comprises user data, error detection data and error correction data, wherein error detection data is used to detect a data error in said user data and said error correction data is used to correct said data error in user data, said method comprising:

obtaining said user data and said error detection data from a portion of said flash memory device or a sector of said hard disk drive;

evaluating said error detection data to determine if there is a data error;

obtaining said error correction data from said portion of said flash memory device or said sector of said hard disk drive only if a data error is detected;

providing an indicator to said flash memory device or said hard disk drive to suspend data transmission if a data error is detected.

2. The method of claim 1, wherein said error detection data comprises a cyclic redundancy check.

3. The method of claim 1, wherein said error correction data comprises parity check data.

4. The method of claim 1, wherein said data is encoded using a Reed Solomon code.

5. The method of claim 1, wherein said data is encoded using a LDPC code.

6. The method of claim 1, wherein said data is encoded using one or more of turbo codes, convolutional codes, parity check codes, BCH codes and trellis codes.

7. The method of claim 1, wherein said evaluating step is performed by a control system.

8. The method of claim 1, wherein said memory device hard disk drive is part of a Hard Disk Drive (HDD) storage system.

9. The method of claim 1, wherein said flash memory device is part of a Solid State Drive (SSD) storage system.

10. The method of claim 1, wherein said data comprises one or more of hard information and soft information.

11. A method performed by a memory device for reading data from a memory media associated with said memory device, wherein said data comprises user data, error detection data and error correction data, wherein said error detection data is used to detect said data error in said user data, said method comprising:

transmitting said data and said error detection data to a control system;

receiving an indicator from said control system to suspend said transmission if a data error is detected based on an evaluation of said error detection data;

suspending said transmitting step if said indicator indicates that said data error is detected, wherein said control system evaluates said error detection data to detect said data error and generates said indicator when an error is detected; and transmitting said error correction data to said control system only if said data error is detected.

12. The method of claim 11, wherein said error detection data comprises a cyclic redundancy check.

13. The method of claim 11, wherein said error correction data comprises parity check data.

14. The method of claim 11, wherein said data is encoded using one or more of Reed Solomon codes, LDPC codes, turbo codes, convolutional codes, parity check codes, BCH codes and trellis codes.

15. The method of claim 11, wherein said memory device is part of one or more of a Hard Disk Drive (HDD) storage system and a Solid State Drive (SSD) storage system.

16. The method of claim 11, wherein said memory device is part of one or more of a Hard Disk Drive (HDD) storage system and a Solid State Drive (SSD) storage system.

17. The method of claim 11, wherein said data comprises one or more of hard information and soft information.

18. A control system for obtaining data from one of a flash memory device and a hard disk drive, wherein said data comprises user data, error detection data and error correction data, wherein said error detection data is used to detect a data error in said user data and said error correction data is used to correct said data error in said user data, said control system comprising:

at least one processor, coupled to said flash memory device or said hard disk drive, operative to:

obtain said user data and said error detection data from a portion of said flash memory device or a sector of said hard disk drive;

evaluate said error detection data to determine if there is a data error;

obtain said error correction data for said portion of said flash memory device or said sector of said hard disk drive only if a data error is detected; and provide an indicator to said flash memory device or said hard disk drive to suspend said transmission if a data error is detected.

19. The control system of claim 18, wherein said error detection data comprises a cyclic redundancy check.

20. The control system of claim 18, wherein said error correction data comprises parity check data.

21. The control system of claim 18, wherein said data is encoded using one or more of Reed Solomon codes, LDPC codes, turbo codes, convolutional codes, parity check codes, BCH codes and trellis codes.

22. The control system of claim 18, wherein said evaluation is performed by a control system.

23. The control system of claim 18, wherein said hard disk drive is part of a Hard Disk Drive (HDD) storage system and said flash memory device is part of a Solid State Drive (SSD) storage system.

24. The control system of claim 18, wherein said data comprises one or more of hard information and soft information.

25. A memory system for reading data from a flash memory device or a hard disk drive associated with said memory device, wherein said data comprises user data, error detection data and error correction data, wherein said error detection data is used to detect a data error in said user data and said error correction data is used to correct said data error in said user data, said memory system comprising:

at least one processor, coupled to the flash memory device or a hard disk drive, operative to:

transmit said data and said error detection data to a control system;

receive an indicator from said control system to suspend said transmission if a data error is detected based on an evaluation of said error detection data;

suspend said transmitting step if said indicator indicates that said data error is detected, wherein said control system evaluates said error detection data to detect said data error and generates said indicator when an error is detected; and transmit said error correction data to said control system only if said data error is detected.

* * * * *